(12) United States Patent
Triyoso et al.

(10) Patent No.: US 10,236,343 B2
(45) Date of Patent: Mar. 19, 2019

(54) STRAIN RETENTION SEMICONDUCTOR MEMBER FOR CHANNEL SIGE LAYER OF PFET

(71) Applicant: GLOBALFOUNDRIES INC., Grand Cayman (KY)

(72) Inventors: Dina H. Triyoso, Mechanicville, NY (US); Timothy J. McArdle, Ballston Lake, NY (US); Judson R. Holt, Ballston Lake, NY (US); Amy L. Child, Wilton, NY (US); George R. Mulfinger, Gansevoort, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/848,591

(22) Filed: Dec. 20, 2017

(65) Prior Publication Data
US 2018/0190768 A1   Jul. 5, 2018

Related U.S. Application Data

(60) Provisional application No. 62/440,469, filed on Dec. 30, 2016.

(51) Int. Cl.
| | |
|---|---|
| *H01L 29/06* | (2006.01) |
| *H01L 29/78* | (2006.01) |
| *H01L 21/762* | (2006.01) |
| *H01L 29/66* | (2006.01) |
| *H01L 29/786* | (2006.01) |

(52) U.S. Cl.
CPC ...... *H01L 29/0649* (2013.01); *H01L 21/7624* (2013.01); *H01L 21/76224* (2013.01); *H01L 29/66477* (2013.01); *H01L 29/66628* (2013.01); *H01L 29/7842* (2013.01); *H01L 29/7846* (2013.01); *H01L 29/78684* (2013.01)

(58) Field of Classification Search
CPC .......... H01L 29/0649; H01L 29/66477; H01L 21/76224; H01L 29/7846; H01L 21/7624
See application file for complete search history.

(56) References Cited

U.S. PATENT DOCUMENTS

| | | | |
|---|---|---|---|
| 9,871,057 B2 * | 1/2018 | Nummy | H01L 27/1203 |
| 2006/0011984 A1 * | 1/2006 | Currie | H01L 21/76254 257/352 |
| 2017/0256565 A1 * | 9/2017 | Nummy | H01L 27/1203 |

* cited by examiner

*Primary Examiner* — Selim U Ahmed
(74) *Attorney, Agent, or Firm* — Anthony Canale; Hoffman Warnick LLC (57) ABSTRACT

A pFET includes a semiconductor-on-insulator (SOI) substrate; and a trench isolation within the SOI substrate, the trench isolation including a raised portion extending above an upper surface of the SOI substrate. A compressive channel silicon germanium (cSiGe) layer is over the SOI substrate. A strain retention member is positioned between at least a portion of the raised portion of the trench isolation and the compressive cSiGe layer. A gate and source/drain regions are positioned over the compressive cSiGe layer.

12 Claims, 5 Drawing Sheets

STRAIN RETENTION SEMICONDUCTOR MEMBER FOR CHANNEL SIGE LAYER OF PFET

BACKGROUND

The present disclosure relates to integrated circuit fabrication, and more specifically, to a strain retention semiconductor member for a compressive channel silicon germanium (cSiGe) layer for a p-type field effect transistor (pFET), and a related method and IC structure.

In integrated circuits, field effect transistors (FETs) are used widely. The terminals of the FETs are designated source (S), drain (D) and gate (G). FETs rely on an electric field to control the shape and hence the conductivity of a "channel" in a semiconductor material between the source and drain regions. P-type field effect transistors (pFETs) are formed with p-type dopants in the semiconductor material in the source/drain region which generate a free hole (by "accepting" electron from semiconductor atom and "releasing" hole at the same time). Boron (B) is the most common acceptor in silicon technology, but alternatives include indium and gallium.

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (pFET) drive currents). In order to boost the performance of pFETs formed on fully depleted semiconductor-on-insulator (FDSOI) substrates, a compressive channel silicon germanium (cSiGe) layer is used to form the pFET. More specifically, a relatively thin compressive cSiGe layer is formed by, for example, germanium condensation, on the FDSOI substrate before shallow trench isolation (STI) formation in the FDSOI substrate. The gate of the PFET is then formed on the compressive cSiGe layer followed by p-type dopant epitaxy to form raised source and drain regions adjacent the gate. The gate is formed by conventional photolithographic and/or sidewall transfer techniques. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

There are a number of challenges presented by the relatively thin compressive cSiGe layer, which must be addressed as current device miniaturization continues thinning the compressive cSiGe layer, e.g., beyond 6 nm. One of the challenges of using compressive cSiGe is maintaining the compressive strain in the relatively thin compressive cSiGe layer, which can have a thickness of, for example, approximately 6-7 nanometers (nm). In particular, the compressive strain is locked to the FDSOI substrate lattice during formation of the compressive cSiGe layer. Formation of trench isolations in the FDSOI substrate, which is required to insulate different regions/devices formed on the substrate, requires formation of trenches in the FDSOI substrate. The trenches and related thermal activity relaxes or releases the compressive strain in the compressive cSiGe layer, impeding the performance improvements for the pFETs. Another challenge is growing a p-type doped epitaxial layer (e.g., using boron) on the relatively thin compressive cSiGe layer for the raised source/drain regions. In particular, when the compressive cSiGe layer is relatively thin, e.g., approximately 6 nm or less, the epitaxial growth for the raised source/drain regions commonly results in undesirable agglomeration of the semiconductor material. It is therefore difficult to obtain a uniform dopant concentration in the source/drain regions.

SUMMARY

A first aspect of the disclosure is directed to a p-type field effect transistor (pFET), including: a semiconductor-on-insulator (SOI) substrate; a trench isolation within the SOI substrate, the trench isolation including a raised portion extending above an upper surface of the SOI substrate; a compressive channel silicon germanium (cSiGe) layer over the SOI substrate; a strain retention member positioned between at least a portion of the raised portion of the trench isolation and the compressive cSiGe layer; and a gate and source/drain regions over the compressive cSiGe layer.

A second aspect of the disclosure includes a method of forming a field effect transistor (FET), the method including: defining a first active region by forming a trench isolation in a semiconductor-on-insulator (SOI) substrate, the trench isolation including a raised portion extending above an upper surface of the SOI substrate; forming a compressive channel silicon germanium (cSiGe) layer having a strain retention member positioned between at least a portion of the raised portion of the trench isolation and the compressive cSiGe layer; and forming a gate and source/drain regions over the compressive cSiGe layer in the first active region to form the FET.

A third aspect of the disclosure related to an integrated circuit structure, including: a semiconductor-on-insulator (SOI) substrate; a trench isolation within the SOI substrate, the trench isolation including a raised portion extending above an upper surface of the SOI substrate, the trench isolation defining a first active region and a second active region; a compressive channel silicon germanium (cSiGe) layer over the SOI substrate in the first active region; a strain retention member positioned between at least a portion of the raised portion of the trench isolation and the compressive cSiGe layer; a p-type field effect transistor (pFET) over the compressive cSiGe layer in the first active region; and an n-type field effect transistor (nFET) in the second active region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a method of forming a field effect transistor (FET) including a strain retention member for a compressive channel silicon germanium (cSiGe) layer used to form a channel region of the FET, e.g., a p-type field effect transistor (pFET). The pFET and IC structure so formed include the strain retention member capable of retaining the compressive stress in the compressive cSiGe layer despite the layer being relatively thin, e.g., less than approximately 6 nanometers (nm). The strain retention member also allows forming of raised source/drain regions without agglomeration and with uniform dopant concentrations.

Figure 1:
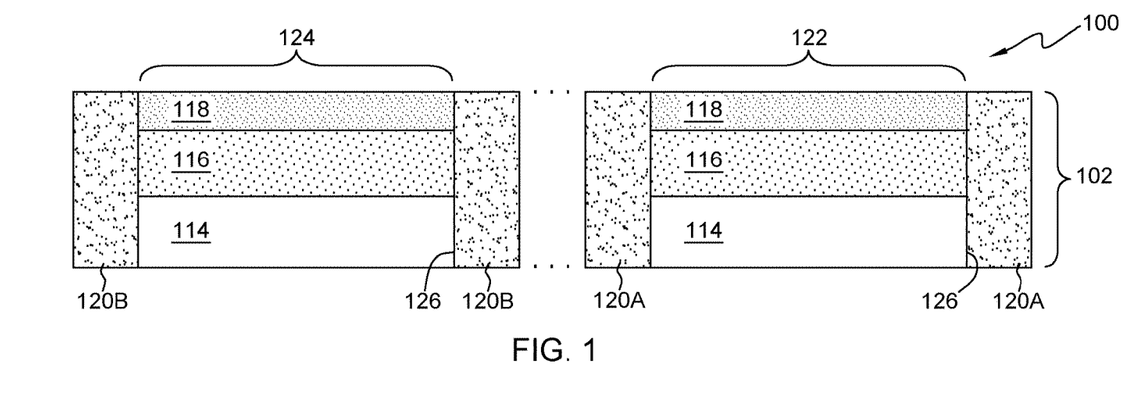
FIGS. 1-6 show cross-sectional views of processes of a method and including a strain retention member, according to embodiments of the disclosure.

Referring to FIGS. 1-6, cross-sectional views of structure undergoing processes of a method according to various embodiments is shown. FIG. 1 shows a preliminary structure 100 including a semiconductor-on-insulator (SOI) substrate 102. SOI substrate 102 typically refers to the use of a layered semiconductor-insulator-semiconductor substrate in place of a more conventional silicon substrate (bulk substrate) in semiconductor manufacturing, especially microelectronics. SOI-based devices differ from conventional silicon-built devices in that the silicon junction is above an electrical insulator, typically silicon dioxide or (less commonly) sapphire. The choice of insulator depends largely on intended, application, with sapphire being used for radiation-sensitive applications and silicon oxide preferred for improved performance and diminished short channel effects in microelectronics devices. The precise thickness of the insulating layer and topmost semiconductor-on-insulator (SOI) layer also vary widely with the intended application. SOI substrate as shown includes a semiconductor substrate 114, a buried insulator layer 116 and an SOI layer 118. Semiconductor substrate 114 and SOI layer 118 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Buried insulator layer 114 may include, for example, oxide.

SOI substrate 102 may be formed using any now known or later developed techniques such as depositing, patterning and etching structure. "Depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

FIG. 1 also shows defining a first active region 122 by forming a trench isolation 120A in SOI substrate 102, and defining a second active region 124 by forming a trench isolation 120B in SOI substrate 102. As understood, trench isolation 120A, 120B may be two isolations or one, single isolation. Trench isolation(s) 120A, 120B may include any now known or later developed trench isolations such as shallow trench isolations (STI). Generally, a trench(es) 126 is/are etched into SOI substrate 102 for trench isolation(s). "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. As shown, trench(es) 126 may be filled (by deposition) with an insulating material such as oxide, to isolate one region of the substrate from an adjacent region of the substrate, i.e., defining first active region 122 and second active region 124. As will be described, one or more transistors of a given polarity may be disposed within an area isolated by trench isolation 120A, 120B. It is noted that trench isolation 120A, 120B are typically not formed at this stage, but rather after formation of a compressive channel silicon germanium (cSiGe) layer and perhaps other structure over SOI layer 118. The conventional process, as noted herein, leads to relaxation or release of the compressive stress from the compressive cSiGe layer, and epitaxy agglomeration during source/drain region formation.

Figure 2:
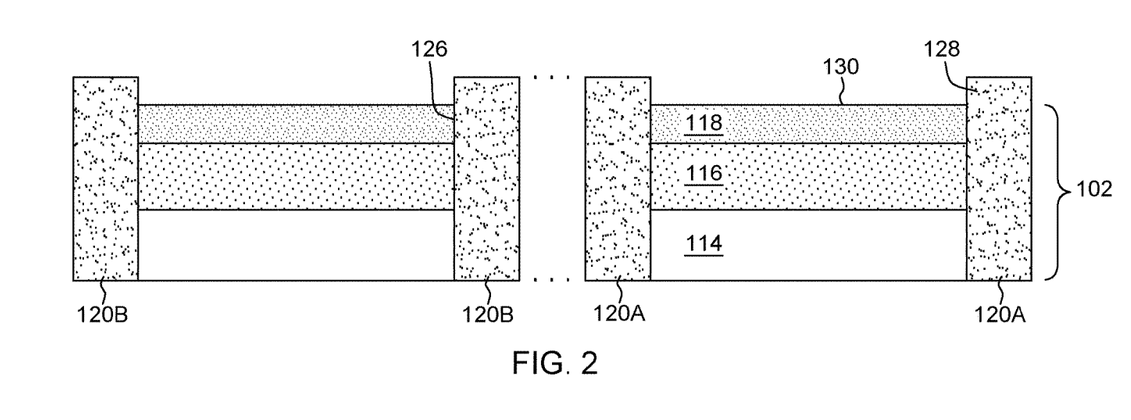

FIG. 2 shows forming of trench isolation 120A (and isolation 120B, if desired) with a raised portion 128 extending above an upper surface 130 of SOI substrate 102, i.e., above SOI layer 118. Trench isolation(s) 120A, 120B may be formed with raised portions 128 by, for example, etching back SOI layer 118 after trench isolations 120A, 120B are initially formed, e.g., using a RIE.

Figure 4:
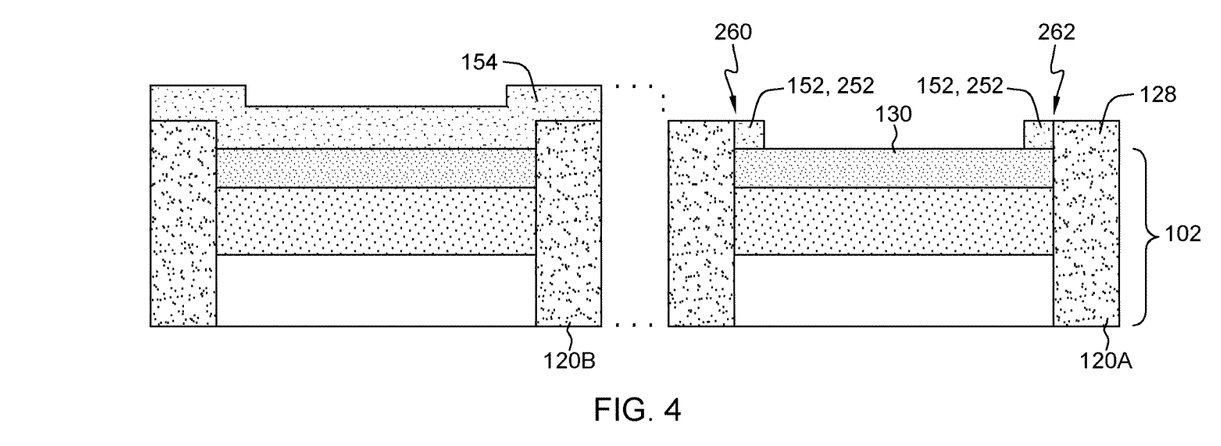
Figure 5:
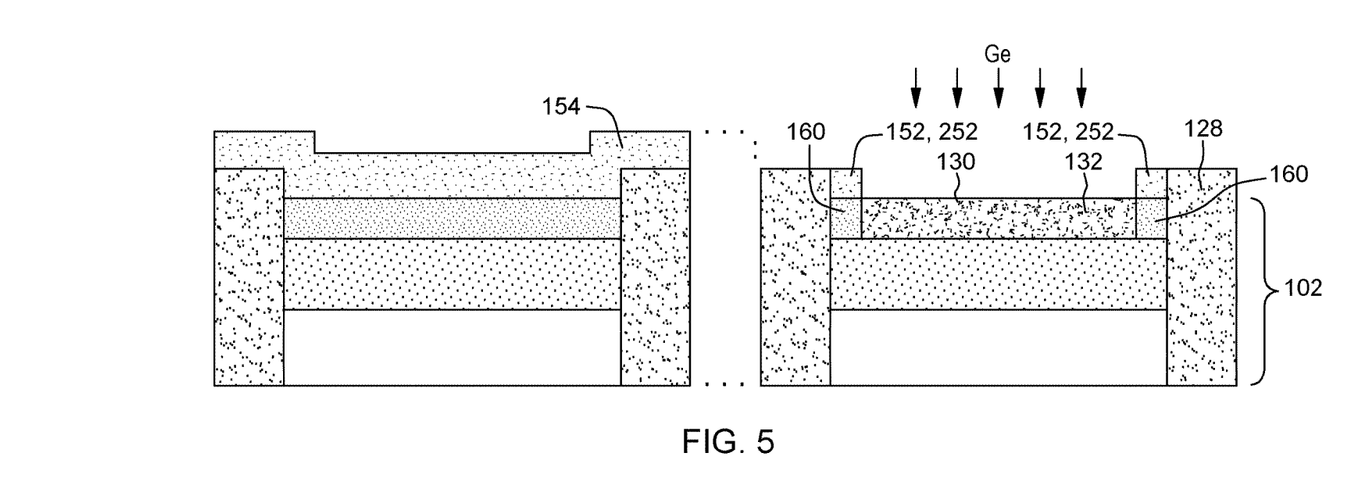
Figure 6:
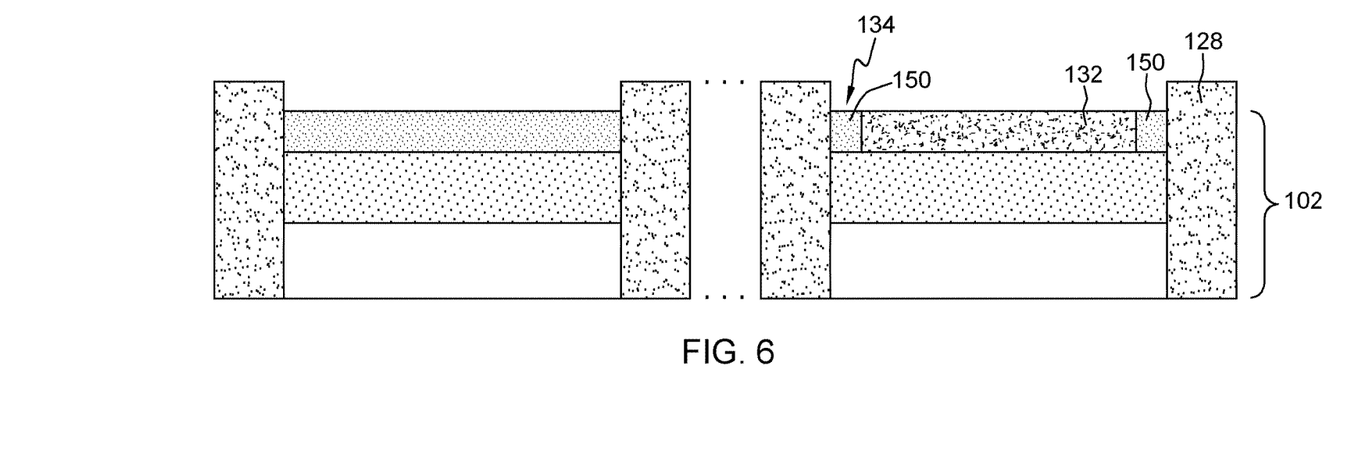
Figure 7:
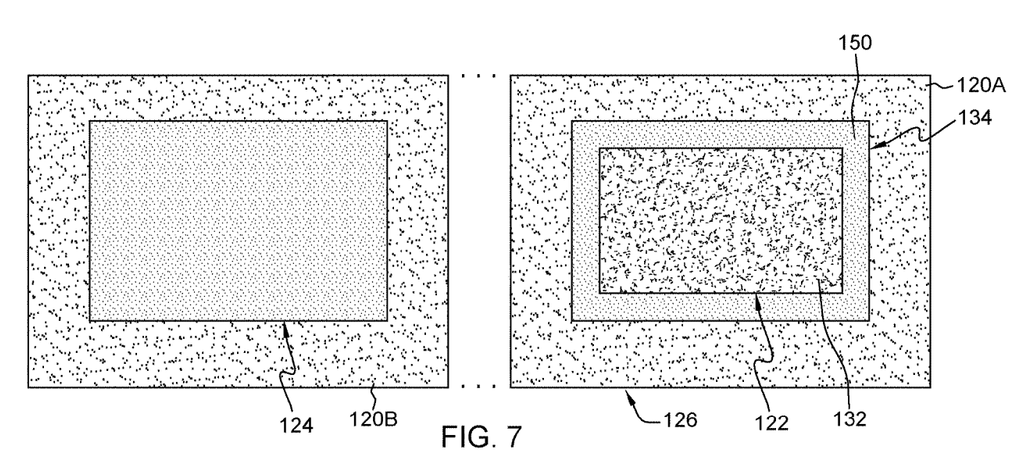
FIG. 7 shows a top view of the structure of FIG. 6 including the strain retention member.

FIG. 3-7 show forming a compressive channel silicon germanium (cSiGe) layer 132 (FIGS. 5-7) having a strain retention member 134 (FIGS. 6-7) positioned between at least a portion of the raised portion 128 of trench isolation 120A and compressive cSiGe layer 132, according to one embodiment of the disclosure. The FIGS. 3-7 processes result in a strain retention member 134 that includes a strain retention semiconductor ring 150 (FIGS. 6-7).

Figure 3:
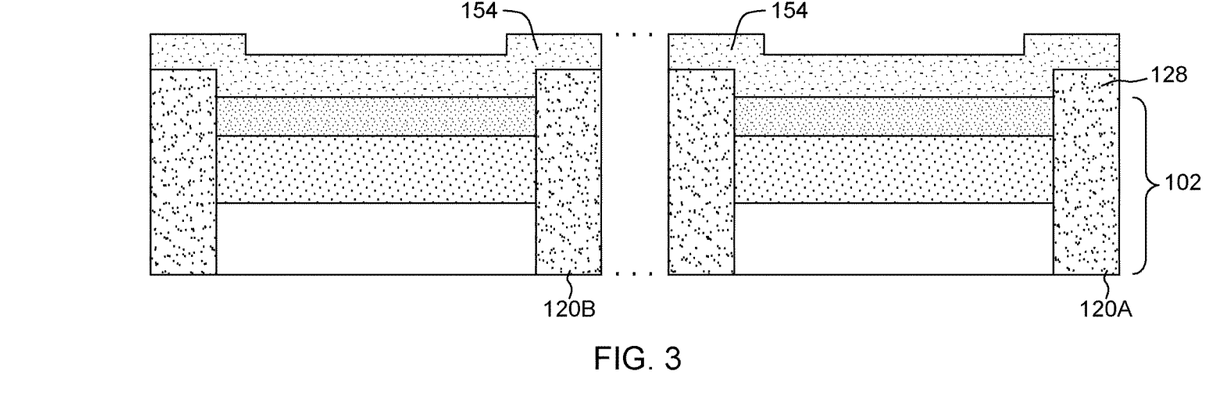

FIGS. 3-5 show forming a spacer ring 152 (FIGS. 4-5) adjacent raised portion 128 of trench isolation 120A (not 120B) and exposing SOI layer 118 (FIG. 2) of SOI substrate 102 within spacer ring 152. As shown in FIG. 3, spacer ring 152 may be formed, for example, by depositing a hard mark 154 over trench isolation 120A (and 120B) and SOI substrate 102, e.g., by deposition. As shown in FIG. 4, hard mask 154 may be patterned and etched to form spacer ring 152 adjacent raised portion 128 of trench isolation 120A. The etching may include, for example, performing an anisotropic etching. Spacer ring 152 leaves SOI layer 118 of SOI substrate 102 exposed within the spacer ring. That is, upper surface 130 of SOI layer 118 is exposed within spacer ring 152. Hard mask 154, and hence spacer ring 152, may include any now known or later developed hard mask material. In one embodiment, hard mask 154 includes silicon nitride; hence, spacer ring 152 includes silicon nitride.

FIG. 5 shows forming compressive cSiGe layer 132 over exposed SOI layer 118. Compressive cSiGe layer 132 may be formed at least in part, for example, by condensing germanium (Ge) onto SOI layer 118. Other processes of forming compressive cSiGe layer 132 may be also be employed. One manner of providing the compressive stress is referred to as stress memorization technique (SMT), which includes applying an intrinsically compressively stressed material (e.g., silicon nitride) over the channel region and annealing to have the stress memorized therein. The stressed material is then removed. The stress, however, remains and improves hole mobility, which improves overall pFET performance. The anneal step may be provided as part of a dopant activation anneal. Other techniques may also be employed. In accordance with embodiments of the disclosure, compressive cSiGe layer 132 is a relatively thin layer compared to the rest of the surrounding structure. For example, for a 22 nm technology node, compressive cSiGe layer 132 may have a thickness of less than approximately 6 nanometers. As technology nodes advance, compressive cSiGe layer 132 may be even thinner. As illustrated in FIG. 4, spacer ring 152 shields a ring portion 160 of SOI layer 118 from the germanium. Consequently, ring portion 160 remains a germanium-free semiconductor material. In one embodiment, SOI substrate 102 includes a silicon SOI (upper) layer 118, thus strain retention member 134 includes silicon.

FIG. 6 shows removing hard mask 154 and spacer ring 152, which leaves strain retention semiconductor ring 150 in SOI layer 118 about compressive cSiGe layer 132. As shown in the plan view of FIG. 7, strain retention semiconductor ring 150 encloses compressive cSiGe layer 132 such that compression strain is retained therein. That is, strain retention ring 150 surrounds compressive cSiGe layer 132 and isolates it from trench isolation 120A, retaining the compressive stress therein.

Figure 8:
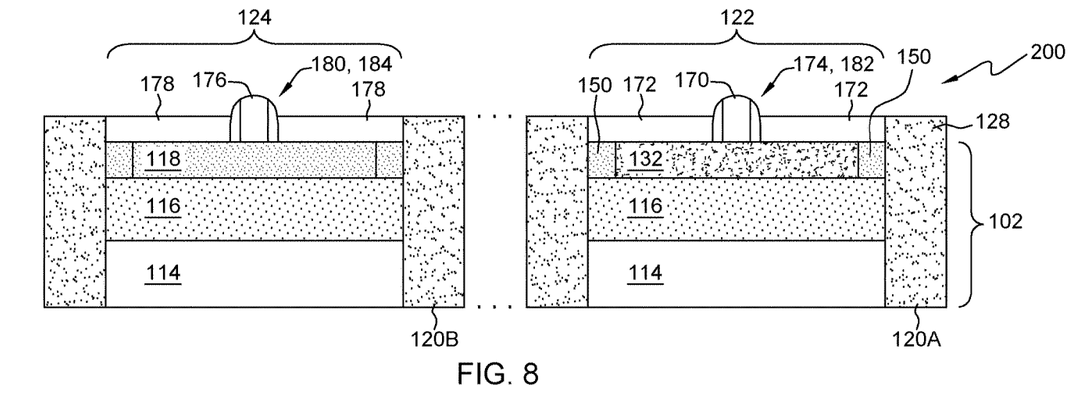
FIG. 8 shows a cross-sectional view of another process of a method according to embodiments of the disclosure, including a pFET and IC structure according to embodiments of the disclosure.

FIG. 8 shows forming a gate 170 and source/drain regions 172 over compressive cSiGe layer 132 in first active region 122 to form FET 174. In particular, FIG. 8 shows forming source/drain regions 172 over compressive cSiGe layer 132 in first active region 122 to form FET 174. As will be described, FET 174 may be doped with a p-type dopant to form a pFET 182. FIG. 8 also shows forming, within second active region 124 defined by trench isolation 120B formed in SOI substrate 102, an n-type FET (nFET) 184. That is, FIG. 8 also shows forming a gate 176 and source/drain regions 178 in second active region form FET 180. Gate 170, 176 and source/drain regions 172, 179 may be formed using any now known or later developed technology. For example, gates 170, 176 may be formed using deposition of gate materials, e.g., metal or polysilicon, and patterning using photolithography or sidewall image transfer techniques, etc. Source/drain regions 172, 178 may be formed using, for example, epitaxial growth. Source/drain regions 172, 178 may be raised (shown, to be adjacent gate 170) or non-raised. Source/drain regions 172 within first active region 122 may be doped with a p-type dopant, e.g., boron (B), indium (In) or gallium (Ga), either in-situ or using ion implantation, to form pFET 182. In one embodiment, the p-type dopant includes boron. Performance of pFET 182 may be improved due to the improved retention of compressive strain in compressive cSiGe layer 132 provided by strain retention member 134. In addition, employing strain retention member 134 reduces or eliminates epitaxy agglomeration during source/drain region 172 formation. Hence, source/drain regions 172 may also have a more uniform dopant concentration. No additional masks layers or process steps are required to implement the teachings of the disclosure. In second active region 124, source/drain regions 178 may be doped with an n-type dopant, either in-situ or using ion implantation, to form an nFET 184. N-type dopant may include but is not limited to: phosphorous (P), arsenic (As) and antimony (Sb).

Figure 9:
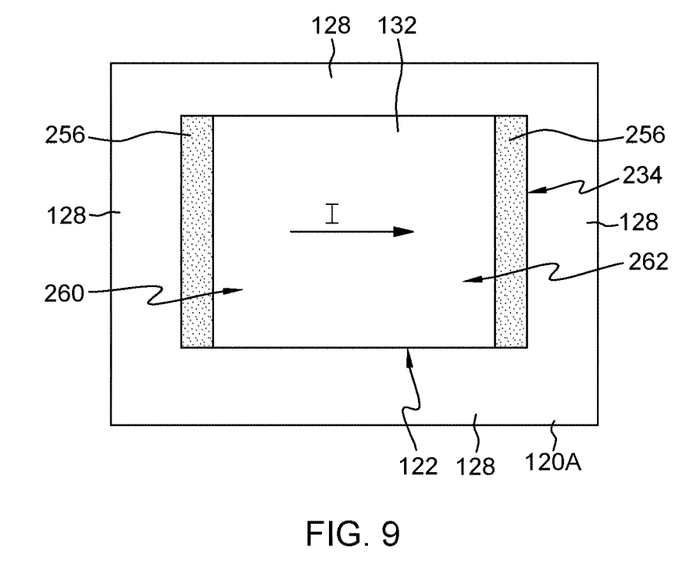
FIGS. 9 and 10 show top views of a strain retention member according to alternative embodiments of the disclosure.
Figure 10:
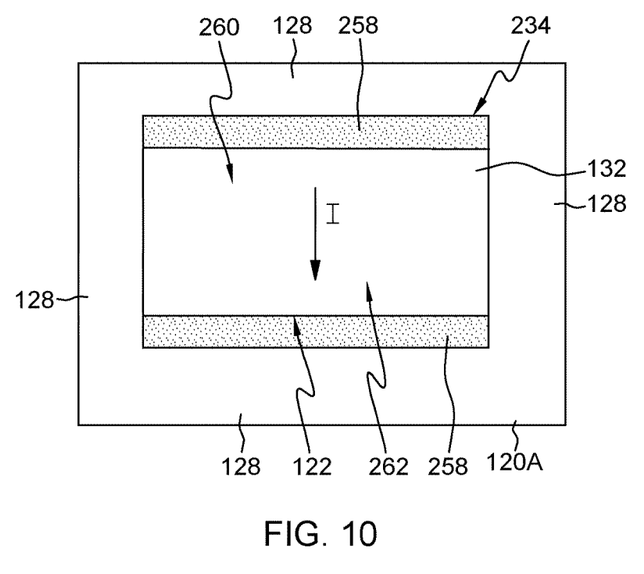

Returning to FIG. 5, and with reference to the plan views of FIGS. 9 and 10, alternative embodiments of a strain retention member 234 will be described. In FIGS. 9 and 10, rather than a ring 150 (FIG. 7), a strain retention member 234 may include a pair of strain retention semiconductor elements 256 (FIG. 9) or 258 (FIG. 10) on opposing sides 260, 262 of first active region 122 and compressive cSiGe layer 132. The opposing sides 260, 262 of first active region 122 may be selected depending on the expected current flow direction I therethrough. In particular, the opposing sides 260, 262 may be selected to face the current flow direction. In FIG. 9, current flow direction I is left-to-right across the page (or vice versa), hence, elements 256 are on the right and left sides of compressive cSiGe layer 132. In FIG. 10, current flow direction I is from top-to-bottom on the page (or vice versa), hence, elements 258 are on the top and bottom sides of compressive cSiGe layer 132. Each semiconductor element 256, 258 is positioned adjacent a portion of raised portion 128 of trench isolation 120A to retain compressive stress along the line of current flow. In this regard, as shown in FIG. 4, compressive cSiGe layer 132 forming may include forming a spacer 252 (appears same as spacer ring 152 in cross-section) adjacent each of a pair of opposing sides 260, 262 of raised portion 128 of trench isolation 120A and exposing SOI layer 118 of SOI substrate 102 laterally between the pair of opposing sides. Spacer 252 is formed on cover areas of SOI layer 118 desired to be strain retention semiconductor elements 256, 258. Compressive cSiGe layer 132 is then formed, as described herein relative to FIG. 5, over exposed SOI layer 118 by, for example, condensing germanium thereon, and spacer 252 shields SOI layer 118 from the germanium. Hard mask 154 and spacer 252 may then be removed, as described herein relative to FIG. 6, leaving pair of strain retention semiconductor elements 256 (FIG. 9) or 258 (FIG. 10) in SOI layer 118 on opposing sides 260, 262 of compressive cSiGe layer 132. Processing may then proceed as described relative to FIG. 8. Performance of pFET 182 may be improved due to the improved retention of compressive strain in compressive cSiGe layer 132 provided by strain retention member 234 (FIGS. 9 and 10). In addition, employing strain retention member 234 (FIGS. 9 and 10) reduces or eliminates epitaxy agglomeration during source/drain region 172 formation, and provides a more uniform dopant concentration.

Regardless of the form of the strain retention member employed, in accordance with embodiments of the disclosure, as shown in FIG. 8, pFET 182 may include SOI substrate 102 with trench isolation 120A therewithin including raised portion 128 extending above upper surface 130 (FIG. 2) of SOI substrate 102. pFET 182 also includes compressive cSiGe layer 132 over SOI substrate 102, i.e., over SOI layer 118. Compressive cSiGe layer 132 may have a thickness of less than approximately 6 nanometers. Strain retention member 134 (FIG. 7), 234 (FIGS. 9-10) may be positioned between at least a portion of raised portion 128 of trench isolation 120A and compressive cSiGe layer 132. In the FIGS. 6 and 7 embodiments, strain retention member 134 includes strain retention semiconductor ring 150 that extends about first active region 122 and compressive cSiGe layer 132, i.e., it is positioned between all of compressive cSiGe layer 132 and trench isolation 120A. In FIGS. 9 and 10, strain retention member 234 includes pair of (opposing) semiconductor elements 256 or 258, respectively, on opposing sides 260, 262 of first active region 122 and compressive cSiGe layer 132. Each semiconductor element 256 or 258 is adjacent only a portion of raised portion 128 of trench isolation 120A, i.e., they only abut a portion of raised portion 128 of trench isolation 120A. pFET 182 may include gate 170 and source/drain regions 172 over compressive cSiGe layer 132, at least the latter of which is doped with a p-type dopant. Where SOI substrate 102 includes silicon-on-insulator upper layer 118 and strain retention member 134, 234 includes silicon. An integrated circuit (IC) structure 200 according to embodiments of the disclosure is also shown in FIG. 8. IC structure 200 includes pFET 182 and also nFET 184 in second active region 124.

Strain retention member 134, 234 as described herein provides support at trench isolation 120A boundary to retain compressive strain in compressive cSiGe layer 132 to reduce or eliminate raised source/drain epitaxy agglomeration. While particular arrangements of strain retention semiconductor member 134, 234 have been described herein, it is emphasized that other arrangements may be possible to address different current flow directions and/or different compression strain situations.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A p-type field effect transistor (pFET), comprising:
   a semiconductor-on-insulator (SOI) substrate;
   a trench isolation within the SOI substrate, the trench isolation including a raised portion extending above an upper surface of the SOI substrate;
   a compressive channel silicon germanium (cSiGe) layer over the SOI substrate;
   a strain retention member positioned between at least a portion of the raised portion of the trench isolation and the compressive cSiGe layer, the strain retention member including a semiconductor ring extending about a first active region and the compressive cSiGe layer; and
   a gate and source/drain regions over the compressive cSiGe layer.

2. The pFET of claim 1, wherein the SOI substrate includes a silicon-on-insulator upper layer, and the strain retention member includes silicon.

3. The pFET of claim 1, wherein the compressive cSiGe layer has a thickness of less than approximately 6 nanometers.

4. A method of forming a field effect transistor (FET), the method comprising:
   defining a first active region by forming a trench isolation in a semiconductor-on-insulator (SOI) substrate, the trench isolation including a raised portion extending above an upper surface of the SOI substrate;
   forming a compressive channel silicon germanium (cSiGe) layer having a strain retention member positioned between at least a portion of the raised portion of the trench isolation and the compressive cSiGe layer, the strain retention member including a strain retention semiconductor ring, the forming of the compressive cSiGe layer including:
   forming a spacer ring adjacent the raised portion of the trench isolation using a hard mask and exposing a semiconductor-on-insulator (SOI) layer of the SOI substrate within the spacer ring,
   forming the compressive cSiGe layer over the exposed SOI layer by condensing germanium thereon, the spacer ring shielding a ring portion of the SOI layer from the germanium,
   removing the hard mask and the spacer ring, leaving the strain retention semiconductor ring in the SOI layer about the compressive cSiGe layer; and
   forming a gate and source/drain regions over the compressive cSiGe layer in the first active region to form the FET.

5. The method of claim 4, wherein the spacer ring includes silicon nitride.

6. The method of claim 4, wherein the SOI substrate includes a silicon-on-insulator upper layer, and the strain retention member includes silicon.

7. The method of claim 4, wherein the compressive cSiGe layer forming includes forming the compressive cSiGe layer having a thickness of less than approximately 6 nanometers.

8. The method of claim 4, wherein forming the source/drain regions over the compressive cSiGe layer in the first active region to form the FET includes doping with a p-type dopant to form a p-type FET (pFET).

9. The method of claim 4, further comprising defining a second active region by forming the trench isolation in the SOI substrate, and forming an n-type FET (nFET) in the second active region.

10. An integrated circuit (IC) structure, comprising:
    a semiconductor-on-insulator (SOI) substrate;
    a trench isolation within the SOI substrate, the trench isolation including a raised portion extending above an upper surface of the SOI substrate, the trench isolation defining a first active region and a second active region;
    a compressive channel silicon germanium (cSiGe) layer over the SOI substrate in the first active region;
    a strain retention member positioned between at least a portion of the raised portion of the trench isolation and the compressive cSiGe layer, the strain retention member including a strain retention semiconductor ring extending about the first active region and the compressive cSiGe layer;
    a p-type field effect transistor (pFET) over the compressive cSiGe layer in the first active region; and
    an n-type field effect transistor (nFET) in the second active region.

11. The IC structure of claim 10, wherein the SOI substrate includes a silicon-on-insulator upper layer, and the strain retention member includes silicon.

12. The IC structure of claim 10, wherein the compressive cSiGe layer has a thickness of less than approximately 6 nanometers.

* * * * *